SEMICONDUCTOR DEVICES AND PROCESS FOR EMBEDDING SAME IN PLASTIC

Filed Dec. 16, 1963

INVENTOR
E. R. Williams, Jr.
Robert O. Birchler
BY
E. Mickey Hubbard
Attorney

INVENTOR.
E. R. Williams, Jr.
Robert O. Birchler
BY
E. Mickey Hubbard
Attorney

INVENTOR
E. R. Williams, Jr.
BY Robert O. Birchler
E. Mickey Hubbard
Attorney

United States Patent Office 3,439,238

Patented Apr. 15, 1969

3,439,238

SEMICONDUCTOR DEVICES AND PROCESS FOR EMBEDDING SAME IN PLASTIC

Robert O. Birchler, Richardson, and E. R. Williams, Jr., Dallas, Tex., assignors to Texas Instruments Incorporated, Dallas, Tex., a corporation of Delaware Filed Dec. 16, 1963, Ser. No. 331,006
Int. Cl. H01l 1/10, 1/14, 5/02
U.S. Cl. 317—235 18 Claims

ABSTRACT OF THE DISCLOSURE

A semiconductor device is disclosed in which a plurality of generally parallel conductors are provided, at least one of which has a key portion thereon. A semiconductor wafer is coupled to the key portion while means are provided for coupling the other conductors to the semiconductor wafer. An integrally molded mass of insulation material embeds the semiconductor wafer, and the key portion, as well as the means connecting the conductors to the semiconductor wafer.

The present invention relates generally to the manufacture of semiconductor devices, and more particularly, but not by way of limitation, relates to an improved process for encapsulating electrical circuit devices, such as transistors, integrated circuits and the like, in plastic, and to the novel transistor resulting therefrom.

In general, semiconductor devices are very small and delicate, and economical manufacture of high quality devices in a practical and usable form presents serious difficulties. For example, the devices usually must have electrical leads sufficiently large that they can be easily soldered or otherwise connected in a circuit. The device must be so constructed as to withstand handling and for many applications must withstand high mechanical shock loads. The active components must be encased in an electrically non-conductive environment and should be protected from light. The environment should also be such as will conduct heat away from the active regions of the device.

One common semiconductor device construction is represented by the alloy transistor which in general comprises a relatively large base member having a collector alloyed to one side and an emitter alloyed to the other side. It is customary to mechanically connect the device to a tab portion of a header for support and to make an electrical connection between one atcive region, usually the base, and the header. Two additional lead wires extend through the header and are secured in spaced relationship and insulated by a glob of glass. The other active regions of the alloy device are connected to the ends of the lead wires by very fine whisker wire leads. The active transistor device is then covered by a so-called can which, together with the header, completely encapsulates the active components in a dry ambient. In general, the header constitutes a major portion of the cost of the transistor.

In addition to encapsulating alloy devices in cans, the devices have also been dipped in various liquids which subsequently solidify to form a hard glob of encapsulating material. More recently, the active portions of alloy transistors have been encapsulated in plastic by casting techniques using the conventional expensive header to hold the device during the construction steps and a mold resembling the conventional transistor can. There have been reports that germanium alloy transistors have been encapsulated using transfer molding techniques, but again with the use of expensive headers. Encapsulation of an alloy device is not usually difficult because mechanically it is inherently relatively strong. However, these plastic encapsulated alloy devices have not been generally accepted on the market because of unacceptably high leakage currents.

A planar type transistor offers distinct operating advantages over alloy type devices when encapsulated in a solid environment, such as plastic, because of the fact that the surface junctions between the active regions can be protected by suitable non-conductive material to reduce leakage currents. However, the planar transistor is very small and delicate, and successful encapsulation in plastic, particularly by transfer molding techniques, constitutes a considerable problem. Nearly all commercially available planar transistors are manufactured by using a header and transistor can substantially as heretofore described. However, this type of transistor, with the aid of a header, has been encapsulated by dipping it in a liquid which subsequently solidifies, or by casting an epoxy resin around the active components.

The present invention is concerned with plastic encapsulation of very tiny and very delicate electrical circuit devices by transfer molding techniques, and in particular relates to a process for manufacturing an improved planar type transistor or the like on an economical, mass production basis without the use of a header. In its broader aspects, the invention entails encapsulating a semiconductor or other miniaturizide electrical device having a plurality of electrical terminals in plastic by connecting each of the electrical terminals to a midpoint of a conductor wire and holding the opposite ends of the conductor wires while the device and the adjacent midpoints of the conductor wires are encapsulated in the plastic. More specifically, the novel process entails disposing three relatively large conductor wires in generally parallel relationship, mechanically attaching a transistor wafer to a midpoint of one of the conductors so as to make electrical contact between the conductor and an active region of the wafer, and interconnecting each of the other active regions of the wafer with one of the other conductor wires by very small whisker wire leads. The center portions of the conductors, the transistor wafer and the whisker wire leads are then disposed within a mold cavity with the opposite ends of the conductor wires extending from the mold cavity. The ends of the conductor wires are clamped on each side of the mold cavity to prevent movement of the conductor wires as the fluid plastic material is injected into the mold cavity to encapsulate the transistor.

An important aspect of the invention is the manner in which the fluid plastic material is gated into the mold so as to prevent damage to the delicate whisker wire leads and transistor wafer. In general, this entails introducing the material into a portion of the mold cavity remote from the transistor device and whisker wire leads, and generally parallel to the whisker wire leads.

Another aspect of the invention relates to a complete manufacturing process for assembling, encapsulating and handling a gang of miniaturized devices for convenient testing, processing, and packaging.

The present invention also contemplates a novel transistor construction employing only a single, integral mass of encapsulating material having a unique and useful shape and having leads extending from opposite ends thereof so that the device can be very securely connected to a circuit board.

Therefore, an important object of the present invention is to provide an improved process for manufacturing transistors and other electrical circuit devices having very small active parts and extremely delicate leads on an economical mass production basis.

Another object of the present invention is to provide a process for encapsulating very small and fragile electrical circuit devices in plastic using transfer molding techniques.

Yet another object of this invention is to provide a process for transfer molding a planar device.

Still another object of the invention is to provide a process for encapsulating a transistor by molding without using a header.

Many additional objects and advantages will be evident to those skilled in the art from the following detailed description and drawings, wherein.

Figures 1, 2, 3, 4:
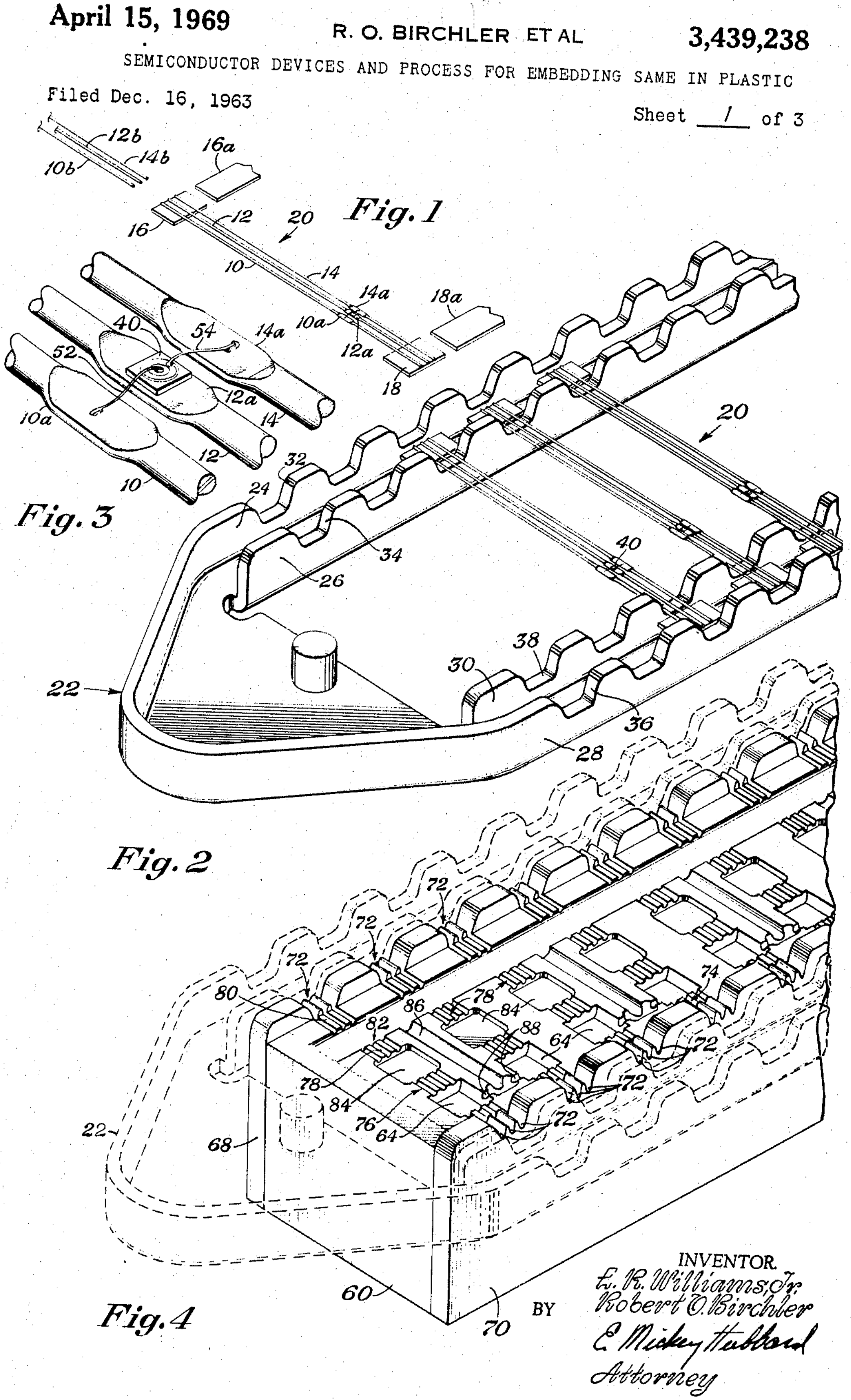
FIGURE 1 is a perspective view of an assembly illustrating an initial step in the process of the present invention.
FIGURE 2 is a perspective view of a portion of a rack holding a plurality of the assemblies shown in FIGURE 1 preparatory to further processing.
FIGURE 3 is an enlarged perspective view of a portion of the assembly of FIGURE 1 illustrating another step of the process of the present invention.
Figure 3A:
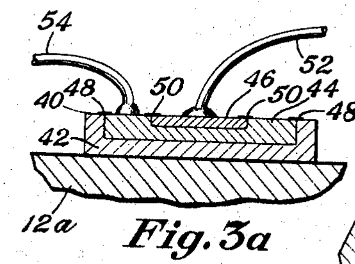
Figure 5:
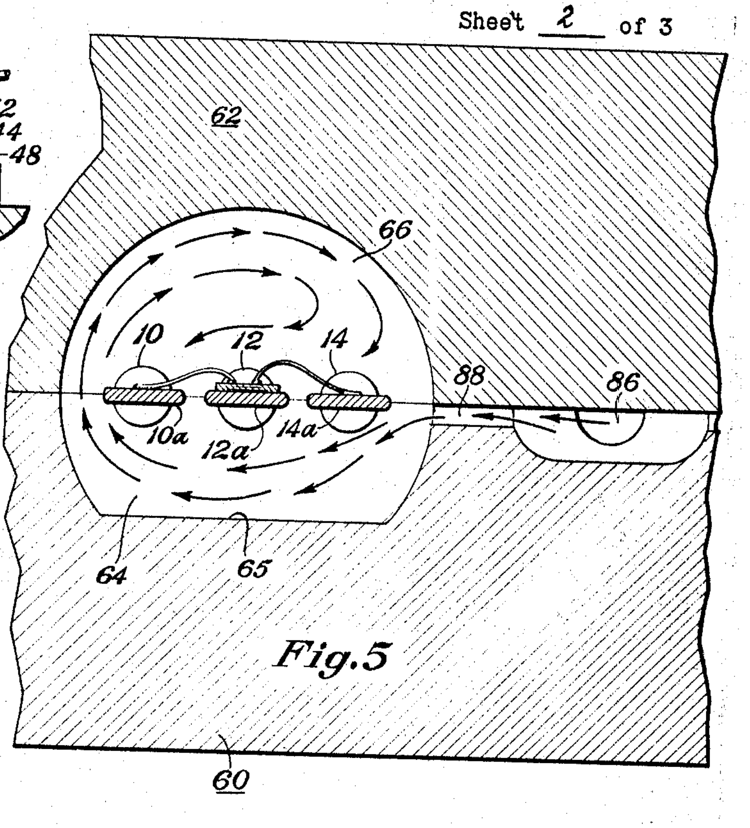
Figure 8A:
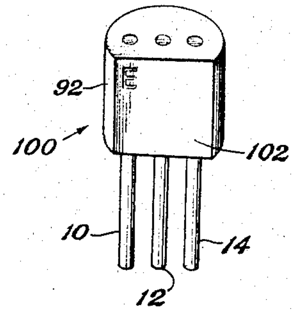
Figure 8B:
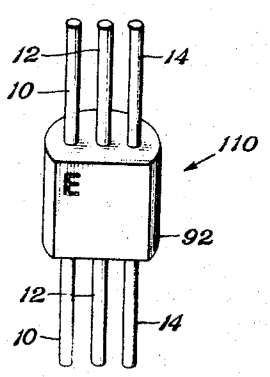
Figure 6:
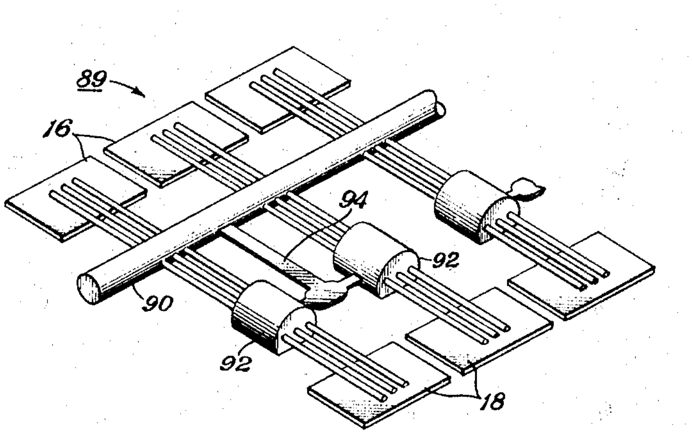
Figure 8C:
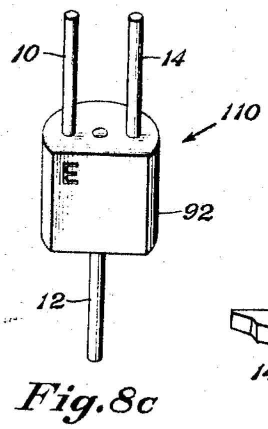
Figure 8D:
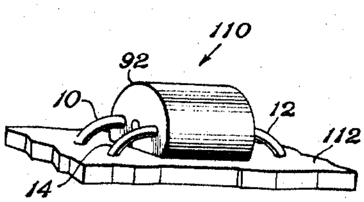
Figure 7:
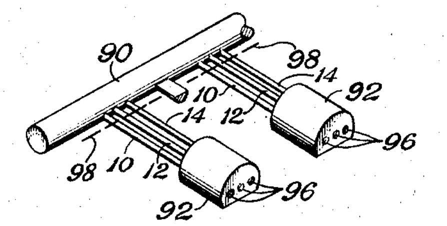

FIGURE 3*a* is an enlarged, partial sectional view of the transistor wafer shown in FIGURE 3;

FIGURE 4 is a perspective view of the lower half of a multiple-mold die which may be used in performing another step in the process of the present invention;

FIGURE 5 is an enlarged sectional view of one of the mold cavities formed by the mating of the die of FIGURE 4 and a complementary die;

FIGURE 6 is a fragmentary perspective view of a gang of transistors when first removed from the mold and serves to illustrate another step of the process of the invention;

FIGURE 7 is a fragmentary perspective view of the gang of transistors illustrated in FIGURE 6 after an intermediate step and preparatory to testing;

FIGURES 8*a*–8*c* are perspective views of various transistors constructed in accordance with the present invention;

FIGURE 8*d* is a perspective view illustrating how the transistor of FIGURE 8*c* can be connected to a circuit board.

Figure 9:
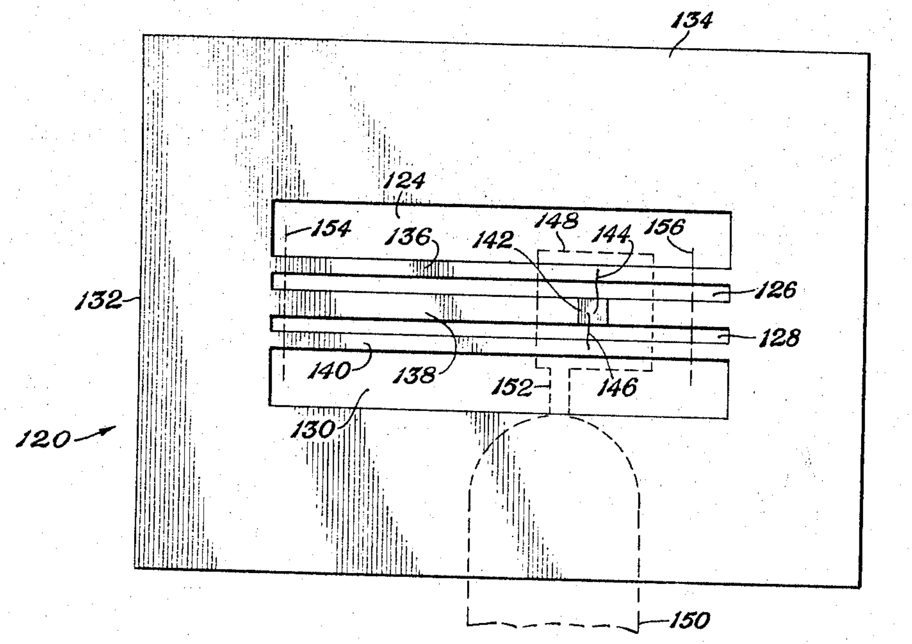
Figure 10:
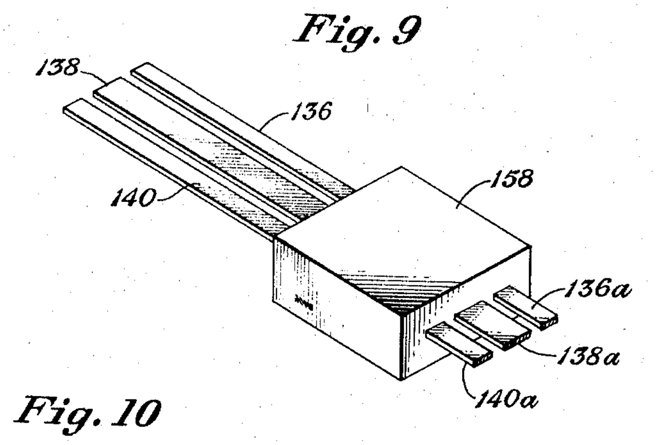

FIGURE 9 is a top view of an intermediate article which serves to illustrate alternative steps which may be employed in practicing the process of the present invention; and FIGURE 10 is a perspective view of another transistor device constructed in accordance with the process illustrated in FIGURE 9.

The process of the present invention will be described in connection with the manufacture of a plurality of transistors and can be best understood by reference to the drawings. Referring now to FIGURE 1, the opposite ends of three conductor wires 10, 12 and 14 disposed generally in parallel relationship and preferably within a common plane, are welded or otherwise attached to metal tabs 16 and 18 to form an assembly designated generally by the reference numeral 20. Intermediate adjacent portions of the conductors are flattened at 10*a*, 12*a* and 14*a*, respectively, for purposes which will hereafter be described. The assembly 20 may be fabricated by any suitable technique. For example, the conductor wires 10, 12 and 14 may conveniently originate from continuous strands 10*b*, 12*b* and 14*b* and the metal tabs 16 and 18 may conveniently originate from continuous metal straps 16*a* and 18*a*, respectively. Then a single tool can simultaneously shear the three conductor wires and the two tabs, weld the ends of the conductor wires to the tabs by passing an electrical current therethrough, and also flatten the portions 10*a*, 12*a* and 14*a* of the wires.

Next a plurality of the assemblies 20 are loaded in a suitable carrier indicated generally by the reference numeral 22 in FIGURE 2. The carrier 22 has a pair of spaced runners 24 and 26 extending along one side and a similar pair of spaced runners 28 and 30 extending along the other side. The runners have a set of aligned notches, 32, 34, 36 and 38, for receiving each of the assemblies 20. It will be noted that the notches are tapered so as to easily receive the assemblies and then accurately guide the assemblies to preselected positions. It will be noted that the tabs 16 are received between the runners 24 and 26, and the tabs 18 are received between the runners 28 and 30. The carrier provides a convenient means for handling a plurality of assemblies 20 through the succeeding steps of the encapsulating operation.

The assemblies 20 should then be immersed in a suitable solvent and cleaner to remove all greases and thoroughly clean the flattened portions 10*a*, 12*a* and 14*a*. A transistor wafer 40 is electrically and mechanically connected to the flattened portion 12*a* of each of the conductor wires 12 by any suitable method. The transistor wafer 40 is preferably of the type illustrated generally by the enlarged sectional view of FIGURE 3*a* and comprises a collector 42 having a base 44 and emitter 46 diffused therein by conventional techniques so as to provide a conventional planar device. Schematically illustrated oxide films 48 and 50 insulate the surface junctions between the active regions to prevent leakage currents in the well-known manner. The transistor wafer 40 may be alloyed to the flattened portion 12*a* so as to provide a good mechanical bond and also to provide an electrical connection between the conductor wire 12 and the collector 42. Next the carrier 22 is placed in a suitable micromanipulating mechanism so that whisker wire leads can be successively attached to the flattened portions of each of the assemblies 20 in the manner illustrated in FIGURE 3. A very fine gold whisker wire lead 54 is attached to the base region 44 of the wafer 40 by a low resistivity connection. The other end of the whisker wire lead 54 is attached to the flattened portion 14*a* of the conductor wire 14. A second whisker wire lead 52 is attached to the emitter 46 of the transistor wafer and to the flattened portion 10*a* of the conductor wire 10. At this point it is well to note that the whisker wire leads 52 and 54 are very small and will customarily be on the order of one mil in diameter as compared to the conductor wires 10, 12 and 14 which will be on the order of ten mils in diameter. It will also be noted that the entire transistor assembly, including the wafer and whisker wire leads, is connected to one side of the assembly 20. The flattened portions of the conductor wires 10, 12 and 14 increase the available surface area for bonding the wafer and whisker wire leads to the conductor wires to thereby increase the strength of the respective bonds. It will also be noticed that the conductor wire 10 is now connected to the base 44 by the whisker lead 52, the conductor wire 12 is connected directly to the collector 42, and the conductor wire 14 is connected to the emitter 46 by the whisker lead 54.

Next the carrier 22 is placed around a lower mold die 60 as illustrated in FIGURE 4. A complementary upper mold die 62 is illustrated only partially in FIGURE 5. The lower mold die 60 has a plurality of mold cavity halves 64 suitably positioned to receive the flattened portions 10*a*, 12*a* and 14*a* of the conductor wires and of course the transistor wafer 40 and whisker leads 52 and 54. The upper die 62 has a corresponding number of mold cavity halves 66, one of which is illustrated in FIGURE 5, arranged in mating relationship with the mold cavity halves 64 in the lower die. The lower die 60 is provided with guide plates 68 and 70 which extend longitudinally along opposite edges of the die.

Each of the guide plates 68 and 70 is provided with three tapered grooves 72 for receiving the conductor wires 10, 12 and 14 of each of the assemblies 20 in the carrier 22. The tapered grooves properly locate the conductor wires so that they are received in grooves 74 and 76 disposed on opposite sides of the mold cavity halves 64, and in similar grooves 78 and 80 which are disposed on either side of a main runner groove 82, the purpose of which will presently be described. The die may be cut away at 84 so as to reduce the likelihood that one of the conductor wires will not lie completely within the grooves 74 or 80. It will also be noted that the lower die cavity halves 64 have a flat bottom 65 for purposes which will hereafter be described in greater detail.

The upper die 62 has a complementary arrangement of grooves for receiving the upper halves of the conductor wires 10, 12 and 14 on each assembly 20 and also has a complementary runner groove for mating with the runner groove 82. However, only the lower die 60 is provided with secondary runner grooves 86 which communicate with the lower mold cavity halves 64 through suitable gates 88, as can best be seen in FIGURE 5. It will be noted that each of the secondary runner grooves 86 communicates with two mold cavity halves 64. In accordance with an important aspect of the invention, it will also be noted that the gates 88 are positioned off-center with respect to the mold cavity halves 64 so that material will be injected into the mold cavity in a predetermined relation to the transistor assembly as will presently be described.

With reference to FIGURE 5, it will be noted that the conductor wires 10, 12 and 14 are clamped between the upper and lower dies and are located within the grooves 74 and 76. It will also be noted that since the transistor wafer 40 and the whisker wire leads 52 and 54 are connected to the tops of the flattened portions 10*a*, 12*a* and 14*a*, the wafer and whisker wire leads are positioned in the upper mold cavity half 66. On the other hand, the gate 88 is located in the lower mold cavity half 64 and as previously mentioned is off-set from the center of the mold cavity so as to direct material into the mold cavity at a point remote from the transistor device and its connecting whisker wire leads. Thus, it will be noted that material will be directed through the gate 88 into the lower mold cavity half 64 along a path generally parallel to the whisker wire leads 52 and 54 as indicated by the arrows in FIGURE 5. Although the mold material is injected at a relatively high velocity transversely of the conductor wires 10, 12 and 14, it will be appreciated that these wires have diameters approximately ten times as great as the whisker wire leads 52 and 54. Further, since the conductor wires 10, 12 and 14 are securely clamped in the grooves between the dies 60 and 62, displacement of the conductor wire is held to an absolute minimum so that the likelihood of breaking the whisker wire leads 52 or 54 is held to a minimum.

In the molding process, the fluid plastic material is transferred under considerable pressure and at substantial velocity down the main runner formed by the groove 82 in the lower die 60 and its mating groove (not illustrated) in the upper die 62. It will be noted that the conductor wires 10, 12 and 14 of each assembly 20 pass through the center of this main runner. However, since the wires are securely held in the grooves 78 and 80 and the mating grooves in the upper die, the wires will not be unduly flexed so as to cause breakage of the connections of the transistor device. The material then passes through the secondary runner grooves 86 and is gated into the die cavities around the flattened portions of the conductor wires and around the transistor device.

After the transfer molding process is completed, the dies 60 and 62 are separated and the gang 89 of encapsulated transistors illustrated in FIGURE 6 is removed. It will be noted that the plastic material remaining in the main runner formed by the runner groove 82 and the complementing groove in the upper die forms a stringer 90 which interconnects the conductor wires of the several transistor devices and holds the wires of each device in spaced relationship. Next the tabs 16 and 18 are removed from the opposite ends of conductor wires 10, 12 and 14 by severing the conductor wires preferably immediately adjacent the end of each encapsulating material 92 and immediately adjacent the stringer 90 substantially as illustrated in FIGURE 7. The surplus mold material 94 from the secondary runner may also easily be broken away by reason of the reduced portions formed by the gates 88 immediately adjacent the transistor device. While the gang of encapsulated transistors are held together by the stringer 90, the ends 96 of the conductor wires 10, 12 and 14 are preferably ground off flush with the end of the encapsulating material 92 and coated with a suitable insulating material. The gang of transistors can also be very easily tested while interconnected by the stringer 90 since the conductor wires 10, 12 and 14 are now electrically isolated one from the other except through the transistor wafer. Finally, the conductor wires 10, 12 and 14 may be severed generally along the dotted lines 98 to complete the transistor construction.

Referring now to FIGURE 8*a*, a transistor constructed in accordance with the present invention is indicated generally by the reference numeral 100. It will be noted that the encapsulating material 92 has a flat face 102 which is disposed parallel to the plane of the three conductor wires extending from the encapsulating material. In addition to assisting the connection of the transistor to a circuit board, as will presently be described, the flat face 102 serves as a reference surface upon which a reference mark, such as the letter E, may be placed to indicate that the left-hand conductor wire 10 is the emitter, the center lead 12 is the collector and the right-hand conductor wire 14 is the base.

Several important aspects of the construction of the transistor 100 will be recalled from the drawings illustrating the intermediate steps of the manufacturing process. For example, it will be recalled that the conductor wires 10, 12 and 14 had flattened portions 10*a*, 12*a* and 14*a*. These flattened portions not only serve to increase the quality of the mechanical and electrical connections between the respective conductor wires and the wafer 40 and the whisker wire leads 52 and 54, but also serve to key each of the conductor wires 10, 12 and 14 in the plastic encapsulating mass so that the respective conductor wires can neither be twisted within the mass nor pulled longitudinally from the mass. In this regard it will be appreciated that very little or no surface bond results between the plastic encapsulating material and the metal conductor wires 10, 12 and 14.

Another important aspect of the present invention is indicated by the transistor device 110 in FIGURE 8*b*. The transistor device 110 may be manufactured by the process previously described except that the conductor wires 10, 12 and 14 may originally be sufficiently long to extend in both directions from the encapsulating material 92. This permits electrical connection to be made with the emitter, collector, and base from either end of the device. But more importantly, the respective conductor wires can subsequently be cut away to a customer's specification so that any arrangement of leads from the emitter, collector and base can be provided for integration into substantially any circuit.

For example, a transistor 110 as illustrated in FIGURE 8*c* can be constructed by severing the conductor wire 12 from one end of the encapsulating material 92 to leave the emitter lead wire 10 and this base wire 14 extending in one direction. At the other end of the encapsulating material 92, the conductor wires 10 and 14 may be severed to leave only the collector wire 12. Then the device 110 may be connected to a circuit board substantially as illustrated in FIGURE 8*d* by placing the flat surface 102 on the surface of the circuit board 112 and passing the conductor wires 10, 12 and 14 through suitable apertures in the circuit board for connection in a circuit on the opposite side of the board. It will be appreciated that the flat surface 102 facilitates the positioning of the device 110 preparatory to connecting the conductor wires 10, 12 and 14 in the circuit, and also facilitates automatic handling and orientation of the device.

As previously mentioned, the conductor wires 10, 12 and 14 may be on the order of 10 mils in diameter so that the transistor described and illustrated will be approximately the same size as standard transistors presently on the market. This wire size provides a very sturdy assembly 20 and permits a simple carrier 22 to be used to handle the assemblies during the various steps of the manufacturing process. However, if it is desired to make the transistors appreciably smaller, the conductor wires must also be made smaller and the assembly 20 does not have sufficient strength to withstand handling. An alternative process for manufacturing a much smaller transistor in accordance with the present invention is illustrated by FIGURES 9 and 10.

Referring now to FIGURE 9, an assembly 120 is formed by punching four elongated slots 124, 126, 128 and 130 from a generally rectangular sheet of thin metal 132. This forms a rectangular support 134 which interconnects the ends of conductor wires 136, 138 and 140, which correspond to the conductor wires 10, 12 and 14 of the assembly 20. A suitable transistor wafer 142 may then be alloyed to the center conductor wire 138 and whisker wire leads 144 and 146 connected to the appropriate active regions of the wafer and to the other conductor wires 136 and 140, respectively. Next one or more of the assemblies 120 can be placed between suitable molding dies which form a mold cavity in the area indicated by the dotted outline 148. The conductor wires 136, 138 and 140 are again tightly clamped between the dies on either side of the mold cavity 148 to hold the conductor wires against the force of the injected plastic.

A runner 150 may be placed in communication with the mold cavity 148 through a suitable gate 152. Again it will be noted that the gate 152 is off-set from the transistor wafer 142 and whisker wire leads 144 and 146, and is preferably located wholly within the portion of the mold cavity formed by the lower die. In this connection, it will be appreciated that the flat conductor wires 136, 138 and 140 may conveniently be received entirely within rectangular grooves in the upper die so that the entire conductor wires will be disposed above the gate 152. Then as the encapsulating material is injected into the mold cavity 148 at a high velocity, it will first enter the cavity below the conductor wires at a point off-set from the fragile whisker wire leads 144 and 146. It will also be noted that the greatest cross-sectional dimensions of the conductor wires 136, 138 and 140 are disposed to receive the major force of the incoming encapsulating material. Further, the leads are securely clamped between the dies on opposite sides of the mold cavity to insure that the leads are not displaced to such an extent as to part one of the whisker leads or to cause a short. All or a portion of the mold cavity 148 may be generally rectangular so as to provide a flat surface for marking and to assist in assembly.

After the transfer molding is completed, the conductor wires 136, 138 and 140 may be severed generally along the dotted lines 154 and 156 to produce the structure illustrated in FIGURE 10. The ends 136*a*, 138*a* and 140*a* of the conductor wires extending from the encapsulating material 158 may be ground away and coated with a suitable insulating material to complete the construction. Or the conductor wires 136, 138 and 140 can initially be long enough to extend in both directions from the encapsulating material 158 in order to produce a device similar to that illustrated in FIGURES 8*b* or 8*c*.

From the above detailed description of preferred embodiments of the present invention, it will be evident that a process for encapsulating very fragile electrical devices having a plurality of electrical leads by transfer molding has been disclosed. The process can be carried out very economically on a mass production basis. The process is particularly adapted to encapsulate a plurality of devices at the same time and to provide a means for subsequently handling a gang of the devices for testing purposes. The process is particularly adapted to the manufacture of transistors, but can be used, in its broader aspects, for manufacturing various other electrical devices such as integrated circuits. The transistor resulting from the process is particularly unique in that leads may extend in either direction from the encapsulating material in order to facilitate connecting the device in a circuit. In particular, the device can be securely connected from a mechanical standpoint to a circuit board or the like. Further, the flattened portions of the conductor wires within the encapsulating material resists both torsional and longitudinal mechanical loads on the conductor wires so that the conductor wires are securely held by the encapsulating material. Any slippage of the conductor wires within the encapsulating material would tend to break the whisker wire lead connections.

The transfermolding technique permits the use of a silicone plastic which results in a better ambient for the planar type transistor device. Further, the transfer molded encapsulation material may have a greater volume of filler without danger of the filler settling out during the molding process. A process for encapsulating very small devices by transfer molding has also been described which eliminates any fabrication steps involved in interconnecting and flattening the conductor wires. This process permits the manufacture of very small devices on a very economical and mass production basis.

Although specific embodiments of the invention have been described in detail, it is to be understood that various changes, substitutions and alterations can be made therein without departing from the spirit and scope of the invention as defined by the apended claims.

What is claimed is:

1. An improved transistor comprising:

three conductor wires disposed generally in parallel relationship and having key portions at least at intermediate points thereon, said key portions having a different cross-section from said conductor wires, a transistor device mechanically connected to one of the conductor wires for support and having active collector, base and emitter regions with one of the active regions electrically connected to the conductor wire, a first whisker wire lead connected to another of the active regions and to another of the conductor wires, a second whisker wire lead connected to the other of the active regions and the other of the conductor wires, and an integrally molded mass of insulating material embedding the transistor device, the whisker wire leads and the key portions of the conductor wires, the opposite ends of the conductor wires extending from the insulating material for connecting the transistor in a circuit.

2. An improved transistor as defined in claim 1 wherein:

a length of one of the conductor wires extends from the insulating material in a direction opposite to the direction in which a length of another of the conductors extends from the insulating material.

3. An improved transistor comprising:

three conductor wires disposed generally in parallel relationship in a common plane and having adjacent flattened portions at intermediate points thereon, a planar transistor wafer having a collector region, a base region diffused into the collector region and an emitter region diffused into the base region, the collector region being mechanically and electrically connected to the flattened portion of the center conductor wire, a first whisker wire lead connected to the base region and to the flattened portions of one of the outer conductor wires, a second whisker wire lead connected to the emitter region and to the flattened portion of the other of the outer conductor wires, and an integrally molded mass of insulating material embedding the wafer, the first and second whisker wire leads, and the flattened portions of the conductor wires with at least one of the conductors extending in both directions from the mass of insulating material.

4. An improved transistor as defined in claim 3 wherein: the three conductor wires extending from one end of the mass of insulating material terminate adjacent the material and are coated with a second insulating material.

5. An improved transistor as defined in claim 3 wherein: at least one of the conductor wires extends from the mass of insulating material in a direction opposite that of another of the conductors whereby opposite ends of the transistor can be securely attached to a circuit board.

6. An improved transistor as defined in claim 3 wherein: the mass of insulating material has a flattened portion disposed generally parallel to the plane of the conductors.

7. An improved transistor comprising:
a plurality of conductor wires disposed generally in parallel relationship and having adjacent key portions at intermediate points thereon, said key portions having a different cross-section from said conductor wires,
a semiconductor device connected to one of the wires for support, the semiconductor device having a plurality of terminals each of which is electrically connected to one conductor wire, and
and integrally molded mass of insulating material embedding the semiconductor device and the key portions of the conductor wires.

8. An improved semiconductor device comprising:
(a) a plurality of conductor wires disposed generally in parallel relationship and having key portions thereon, said key portions having a different cross-section from said conductor wires;
(b) a semiconductor device mechanically connected to one of said conductor wires for support, said device having a plurality of active regions, with one of said active regions electrically connected to said one of said conductor wires;
(c) at least one whisker wire lead connected between another of said active regions and another of said conductor wires; and
(d) an integrally molded mass of insulating material embedding the semiconductor device, the at least one whisker wire lead and the key portions of the conductor wires.

9. An improved semiconductor device in accordance with claim 8 wherein at least one of said key portions extends in the direction of its associated conductor wire.

10. A semiconductor device in accordance with claim 8 wherein said key portions are arranged substantially at one end of said plurality of conductor wires, said device is connected to said one of said conductor wires at the key portion of said one conductor wire, and said key portions are arranged in a common plane.

11. A semiconductor device in accordance with claim 10 wherein said integrally molded mass of insulating material has a flattened portion disposed substantially parallel to said common plane.

12. A semiconductor device consisting of a plurality of generally parallel lead wires, a portion substantially at one end of at least one of the lead wires being flattened, said flattened portion extending in the direction of the lead wire, a semiconductor wafer bonded to a flattened portion substantially at one end of one of said lead wires, a wire bonded to a portion substantially at the end nearest to said semiconductor wafer of each of the other lead wires and to a contact on the semiconductor wafer, and a body of thermosetting plastic encapsulating the connected portions of the lead wires, the semiconductor wafer, and the wires interconnecting the wafer and the portions of the lead wires, the connected portions of the lead wires terminating within said body of thermosetting plastic.

13. The semiconductor device defined in claim 12 wherein the lead wires are substantially parallel and are oriented in the same plane.

14. A semiconductor device in accordance with claim 12 wherein said flattened portion substantially at one end of said one of said lead wires to which said semiconductor wafer is bonded is said flattened portion extending in the direction of said lead wire.

15. A semiconductor device comprising a plurality of generally parallel lead wires extending from one predetermined direction, a portion substantially at one end of at least one of said lead wires being substantially flattened and extending in the direction of the lead wire, a semiconductor wafer secured to a flattened portion substantially at the end of one of said lead wires, means for electrically connecting the respective portions substantially at one end of each of said other lead wires nearest to said semiconductor wafer to a contact on said semiconductor wafer, and a body of thermosetting plastic in engagement with and substantially surrounding the interconnected portions substantially at one end of the lead wires including said one end, the semiconductor wafer, and the means interconnecting the wafer with the respective portions substantially at one end of the lead wires, the interconnected portions of said lead wires terminating within said body of thermosetting plastic.

16. A semiconductor device in accordance with claim 15 wherein said flattened portion substantially at the end of said one of said lead wires to which said semiconductor wafer is secured is said substantially flattened portion extending in the direction of said lead wire.

17. A semiconductor device in accordance with claim 15 wherein a portion substantially at one end of each of said lead wires is flattened and the associated flattened portions substantially at one end of said lead wires are arranged in a single plane.

18. A semiconductor device in accordance with claim 15 wherein said flattened portion is of a different cross-section from the remainder of said lead wire.

References Cited

UNITED STATES PATENTS

| | | | |
|---|---|---|---|
| 2,586,609 | 2/1952 | Burke | 264—272 X |
| 2,757,439 | 8/1956 | Burns | 29—25.3 |
| 3,171,187 | 3/1965 | Ikeda et al. | 29—25.3 |
| 3,221,089 | 11/1965 | Cotton | 264—272 X |
| 3,243,670 | 3/1966 | Durstu et al. | 317—234 |
| 2,737,618 | 3/1956 | Eisler. | |
| 2,745,045 | 5/1956 | Ingraham. | |
| 2,766,410 | 10/1956 | Slade. | |
| 2,850,687 | 9/1958 | Hammes. | |
| 3,176,191 | 3/1965 | Rowe. | |
| 3,235,937 | 2/1966 | Lanzl et al. | |
| 3,250,963 | 5/1966 | Hodges et al. | |
| 3,271,625 | 9/1966 | Caraciolo. | |

OTHER REFERENCES

G.E. Semiconductor Products Department Suppliment to "Active Discrete Pellet Functional Device," Brochure, 11/1963.

JOHN W. HUCKERT, *Primary Examiner.*

R. SANDLER, *Assistant Examiner.*

US. Cl. X.R.

317—234; 29—588, 591